United States Patent
Xu et al.

(10) Patent No.: US 10,409,295 B2
(45) Date of Patent: Sep. 10, 2019

(54) METHODS AND APPARATUS FOR ENHANCED FLOW DETECTION REPEATABILITY OF THERMAL-BASED MASS FLOW CONTROLLERS (MFCS)

(71) Applicant: Applied Materials, Inc., Santa Clara, CA (US)

(72) Inventors: Ming Xu, San Jose, CA (US); Sushant S. Koshti, Sunnyvale, CA (US); Michael R. Rice, Pleasanton, CA (US); Steven E. Babayan, Los Altos, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 15/396,619

(22) Filed: Dec. 31, 2016

(65) Prior Publication Data
US 2018/0188748 A1   Jul. 5, 2018

(51) Int. Cl.
*G05D 7/06* (2006.01)
*G01F 1/684* (2006.01)
(Continued)

(52) U.S. Cl.
CPC .......... *G05D 7/0635* (2013.01); *C23C 14/54* (2013.01); *C23C 16/52* (2013.01); *G01F 1/6847* (2013.01); *G01F 1/696* (2013.01); *G01F 15/14* (2013.01); *G01F 15/185* (2013.01); *Y10T 137/7761* (2015.04)

(58) Field of Classification Search
CPC . C23C 16/40; C23C 16/45525; C23C 14/046; C23C 14/06; G01F 1/68; G01F 1/696; G01F 1/692; G05D 7/0635; Y10T 137/7761; F16L 9/14; F16L 9/147;
(Continued)

(56) References Cited

U.S. PATENT DOCUMENTS

| | | | | |
|---|---|---|---|---|
| 4,355,908 A | * | 10/1982 | Weisser | G01F 1/68 374/39 |
| 4,616,505 A | * | 10/1986 | Jouwsma | G01F 1/692 73/204.26 |

(Continued)

OTHER PUBLICATIONS

International Search Report and Written Opinion of International Application No. PCT/US2017/061862 dated Mar. 16, 2018.
(Continued)

*Primary Examiner* — William M McCalister
(74) *Attorney, Agent, or Firm* — Lowenstein Sandler LLP

(57) ABSTRACT

An electronic device manufacturing system includes a mass flow controller (MFC) that has a thermal flow sensor. The thermal flow sensor may measure a mass flow rate and may include a sensor tube having an inner surface coated with a material to form an inner barrier layer. The inner barrier layer may prevent or substantially reduce the likelihood of a corrosive reaction from occurring on the inner surface, which may prevent or reduce the likelihood of the MFC drifting beyond the MFC's mass flow rate accuracy specifications. This may improve the repeatability of flow detection by the MFC. Methods of measuring and controlling a mass flow rate in an electronic device manufacturing system are also provided, as are other aspects.

17 Claims, 4 Drawing Sheets

(51) Int. Cl.
*G01F 1/696* (2006.01)
*G01F 15/14* (2006.01)
*G01F 15/18* (2006.01)
*C23C 14/54* (2006.01)
*C23C 16/52* (2006.01)

(58) Field of Classification Search
CPC . F16L 58/02; F16L 58/04; F16L 58/08; F16L 58/16
USPC .............................. 137/487.5; 138/145, 146; 73/204.11–204.27
See application file for complete search history.

(56) References Cited

U.S. PATENT DOCUMENTS

| | | | | |
|---|---|---|---|---|
| 4,829,819 A * | 5/1989 | Lefteriou | G01F 1/692 | 73/204.21 |
| 5,259,243 A * | 11/1993 | Drexel | G01F 1/6847 | 73/204.22 |
| 5,730,181 A * | 3/1998 | Doyle | B01D 53/0415 | 137/487.5 |
| 5,792,952 A * | 8/1998 | Ritchart | G01F 1/692 | 73/204.27 |
| 5,811,195 A * | 9/1998 | Bercaw | C23C 8/02 | 427/124 |
| 5,873,951 A * | 2/1999 | Wynns | C10G 9/203 | 148/242 |
| 5,880,365 A * | 3/1999 | Olin | G01F 1/684 | 73/204.22 |
| 5,948,978 A * | 9/1999 | Feller | G01F 1/6847 | 324/706 |
| 6,044,701 A * | 4/2000 | Doyle | G01F 1/6845 | 73/202 |
| 6,125,695 A * | 10/2000 | Alvesteffer | G01F 1/6847 | 73/204.27 |
| 6,216,726 B1 | 4/2001 | Brown et al. | | |
| 6,813,944 B2 * | 11/2004 | Mayer | G01F 1/6847 | 73/204.26 |
| 9,218,997 B2 * | 12/2015 | Jun | H01L 21/67103 | |
| 9,222,172 B2 * | 12/2015 | Rasheed | C23C 16/4404 | |
| 9,397,011 B1 * | 7/2016 | Fang | H01L 21/02274 | |
| 9,698,042 B1 * | 7/2017 | Baldasseroni | H01L 21/6875 | |
| 2003/0192613 A1 * | 10/2003 | Wang | F16L 9/14 | 138/146 |
| 2003/0221483 A1 * | 12/2003 | McMillan | G01F 1/6847 | 73/204.21 |
| 2004/0173019 A1 * | 9/2004 | McMillan | G01F 1/6847 | 73/204.16 |
| 2009/0057134 A1 * | 3/2009 | Walters | C23C 14/0036 | 204/192.12 |
| 2009/0308177 A1 * | 12/2009 | Lammerink | G01F 1/6845 | 73/861.355 |
| 2010/0326539 A1 * | 12/2010 | Smirnov | G01F 1/6842 | 137/468 |
| 2011/0061841 A1 * | 3/2011 | Zolock | G01F 1/6847 | 165/138 |
| 2012/0197446 A1 * | 8/2012 | Glaudel | G05D 7/0635 | 700/282 |
| 2014/0134456 A1 * | 5/2014 | Horton | C22C 1/02 | 428/632 |
| 2014/0260513 A1 * | 9/2014 | Smirnov | G01F 25/0007 | 73/1.34 |
| 2015/0027558 A1 | 1/2015 | Kehoe et al. | | |
| 2015/0308875 A1 * | 10/2015 | Muller | G01F 1/692 | 73/204.26 |
| 2016/0018829 A1 * | 1/2016 | Ellec | G05D 7/0635 | 700/282 |
| 2016/0161308 A1 * | 6/2016 | Schoohf | F16L 58/00 | 73/861.12 |
| 2016/0252372 A1 * | 9/2016 | Rentschler | G01N 27/4077 | 73/431 |
| 2016/0274595 A1 * | 9/2016 | Ohmi | G01F 1/6847 | |
| 2017/0115150 A1 * | 4/2017 | Ikeuchi | G05D 7/0635 | |

OTHER PUBLICATIONS

Brashear et al., U.S. Appl. No. 15/194,360 titled: "Methods, Systems, and Apparatus for Mass Flow Verification Based on Choked Flow," filed Jun. 27, 2016.

Reuter et al., U.S. Appl. No. 15/348,964 titled: "Systems, Apparatus, and Methods for an Improved Load Port Backplane," filed Nov. 10, 2016.

Brashear et al., U.S. Appl. No. 15/070,332 titled: "Methods and Assemblies for Gas Flow Ratio Control," filed Mar. 15, 2016.

Brashear et al., U.S. Appl. No. 15/070,342 titled: "Methods and Assemblies for Gas Flow Ratio Control," filed Mar. 15, 2016.

* cited by examiner

METHODS AND APPARATUS FOR ENHANCED FLOW DETECTION REPEATABILITY OF THERMAL-BASED MASS FLOW CONTROLLERS (MFCS)

FIELD

This disclosure relates to electronic device manufacturing and, more particularly, to mass flow controllers used therein.

BACKGROUND

Electronic device manufacturing systems may include one or more mass flow controllers (MFCs). MFCs measure and control the mass flow rates of process gases used in the manufacture of electronic devices. Process gases may include, e.g., cleaning, deposition, and etchant gases, as well as others, that may be delivered to one or more process chambers in which electronic circuits may be fabricated on semiconductor wafers, glass plates, or like substrates. In some electronic device manufacturing systems, process gases may need to be delivered precisely with mass flow rate accuracies as high as, e.g., +/−1% in order to produce electronic devices having, e.g., microscopically small dimensions. While some mass flow controllers (MFCs) may be able to initially provide such high mass flow rate accuracies, as well as other accuracy tolerances, over time some MFCs may experience a "drift" or shift in their specified mass flow rate accuracies that may exceed their specified tolerances. This may adversely affect the production of the electronic devices being manufactured. Accordingly, improved MFCs are desired.

SUMMARY

According to a first aspect, a mass flow controller is provided. The mass flow controller comprises an inlet port, an outlet port, a thermal flow sensor, a flow rate control valve, and a controller. The thermal flow sensor is configured to measure a mass flow rate of a gas flowing through the mass flow controller. The thermal flow sensor has a sensor tube, and the sensor tube has an input coupled to the inlet port. The sensor tube also has an output, an inner surface, and an outer surface. The inner surface is coated with a material to form an inner barrier layer. The flow rate control valve is coupled between the output of the sensor tube and the outlet port. The flow rate control valve is configured to increase or decrease the mass flow rate of the gas flowing through the mass flow controller. The controller is configured to receive sensor information from the thermal flow sensor and to operate the flow rate control valve.

According to a second aspect, an electronic device manufacturing system is provided. The electronic device manufacturing system comprises a process chamber, a gas delivery system, and a system controller. The process chamber has a substrate support, and the gas delivery system includes a gas supply and a mass flow controller. The mass flow controller includes a thermal flow sensor having a sensor tube. The sensor tube has an input, an output, an inner surface, and an outer surface. The inner surface is coated with a material to form an inner barrier layer. The system controller is configured to operate the process chamber and the gas delivery system.

According to a third aspect, a method of measuring and controlling a mass flow rate in an electronic device manufacturing system is provided. The method comprises providing a mass flow controller comprising a thermal flow sensor having a sensor tube. The sensor tube has an input, an output, an inner surface, and an outer surface. The inner surface is coated with a material to form an inner barrier layer. The method also comprises measuring a mass flow rate via the thermal flow sensor, and adjusting the mass flow rate as needed via the mass flow controller in response to the measuring.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Reference will now be made in detail to example embodiments of the disclosure, which are illustrated in the accompanying drawings. Wherever possible, the same reference numbers will be used throughout the drawings to refer to the same or like parts.

Electronic device manufacturing may involve precise control and delivery of process gases to process chambers in the production of electronic devices. Mass flow controllers (MFCs) are used in gas delivery systems of electronic device manufacturing systems to measure and control a mass flow rate of a process gas flowing there through. However, some MFCs, particularly thermal-based MFCs that have been used with corrosive process gases, may over time no longer accurately measure and control the mass flow rate of process gases flowing there through. That is, such MFCs may experience a drift or shifting of a mass flow rate beyond a specified accuracy of the MFC, which may adversely affect the production yield of the electronic devices being manufactured.

In one aspect, electronic device manufacturing systems include improved MFCs in accordance with one or more embodiments of the disclosure. The improved MFCs may include a thermal flow sensor having a sensor tube at which a mass flow rate of a process gas flowing there through may be measured. Based on the measured mass flow rate and the "setpoint" of the MFC (i.e., the desired mass flow rate), the MFC may operate a flow rate control valve of the MFC as needed to increase or decrease the mass flow rate of the gas flowing through the MFC in order to maintain the setpoint within a predetermined accuracy. The sensor tube may have an inner surface coated with a material to form an inner barrier layer. The inner barrier layer may prevent or substantially delay corrosive process gases flowing there through from adversely affecting the accuracy of the mass flow rate measurements and subsequent flow rate control valve operations performed by the MFC.

Further details of example embodiments illustrating and describing the improved MFCs, as well as other aspects including methods of measuring and controlling a mass flow rate in an electronic device manufacturing system, will be explained in greater detail below in connection with FIGS. 1-4.

Figure 1:
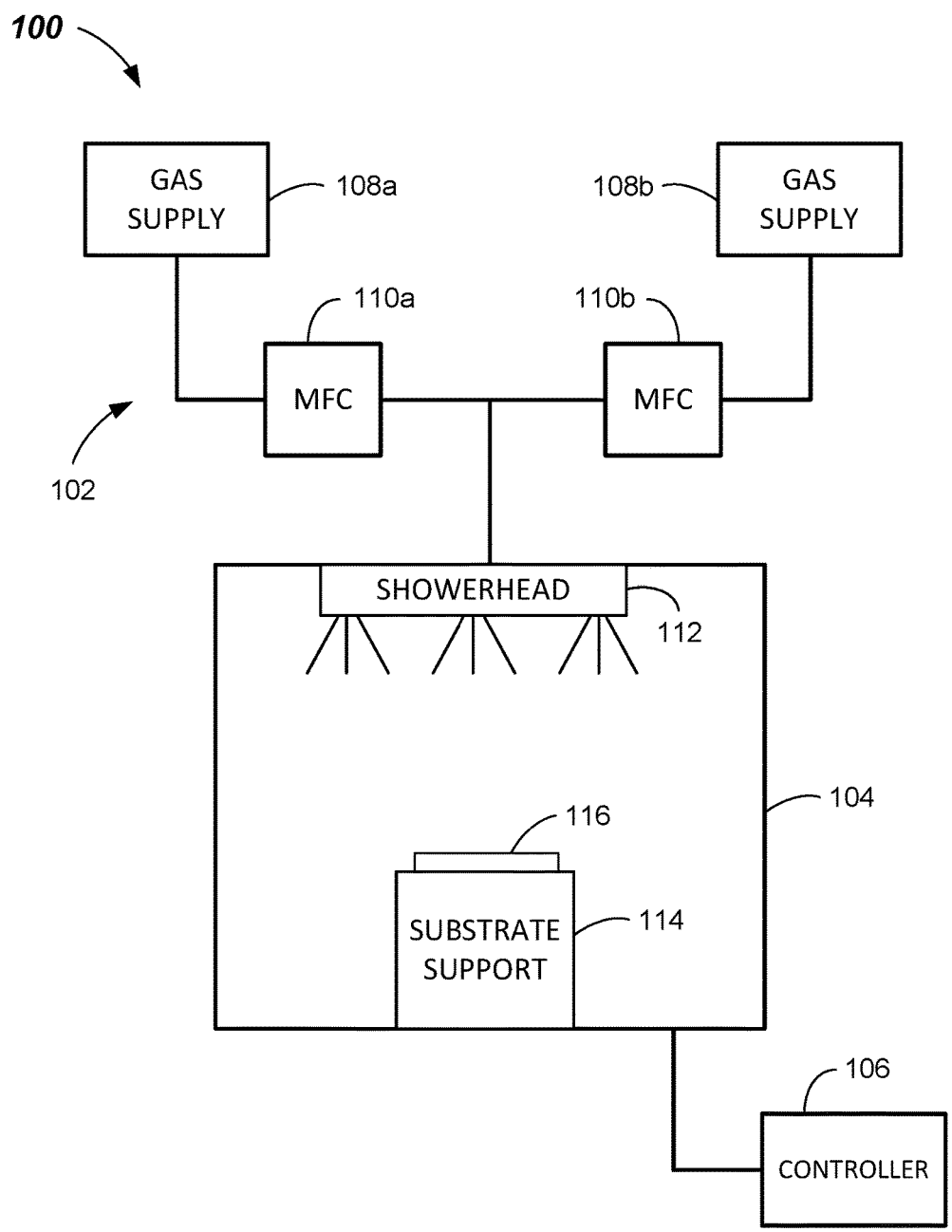
FIG. 1 illustrates an electronic device manufacturing system according to embodiments of the disclosure.

FIG. 1 illustrates an electronic device manufacturing system 100 in accordance with one or more embodiments. Electronic device manufacturing system 100 may include a gas delivery system 102, a process chamber 104, and a system controller 106. Gas delivery system 102 may supply one or more process gases at one or more desired mass flow rates to process chamber 104. Gas delivery system 102 may include a first gas supply 108a coupled to process chamber 104 via a first MFC 110a and a second gas supply 108b coupled to process chamber 104 via a second MFC 110b. In other embodiments, additional or fewer gas supplies and MFCs may be provided for delivering additional or fewer gases to process chamber 104.

MFCs 110a and 110b may each be used to measure and control the flow of gas there through from their respective gas supply 108a and 108b into process chamber 104. That is, MFCs 110a and 110b may each measure a mass flow rate of a gas flowing there through and then adjust, if or as necessary, a flow rate control valve in accordance with a setpoint of the respective MFC. The setpoint may be established by a user and/or system controller 106. MFCs 110a and 110b may each be configured to maintain their rated accuracies as described below in connection with FIGS. 2-4.

Process chamber 104 may be any suitable process chamber for performing one or more processes, such as, e.g., physical vapor deposition (PVD), chemical vapor deposition (CVD), etching, annealing, pre-cleaning, metal or metal oxide removal, or the like, on one or more substrates. Other processes may be carried out on substrates therein. In some embodiments, process chamber 104 may include a showerhead 112 for delivering one or more process gases into process chamber 104 in a predefined pattern, which may depend on the configuration of showerhead 112 (e.g., the number, size, and/or arrangement of gas delivery openings in showerhead 112). In other embodiments, one or more types of nozzles and/or fixtures may alternatively or additionally be used in process chamber 104 to deliver one or more process gases.

Process chamber 104 may also include a substrate support 114 configured to hold a substrate 116 thereon during processing of substrate 116 in process chamber 104. Substrate 116 may be, e.g., a semiconductor wafer, a glass plate, or other suitable type of substrate for fabricating various electrical or other types of devices thereon. Substrate support 114 may include one or more mechanisms for positioning and/or holding substrate 116 in place, such as, e.g., an electrostatic chuck or guide pins. In some embodiments, substrate support 114 may also include suitable equipment for raising and lowering substrate 116, providing and/or removing heat from substrate 116, and/or providing an electrical bias.

System controller 106 may be any suitable computer processor coupled to and/or configured to control one or more components of electronic device manufacturing system 100 either individually or in unison for performing a process within process chamber 104. System controller 106 may include a central processing unit, microcontroller, or other suitable computer processing device; a memory; and support circuits. System controller 106 may be configured to execute programming instructions related to the operation of process chamber 104 and/or to provide instructions to other controllers of electronic device manufacturing system 100, such as, e.g., providing a setpoint to MFC 110a and/or 110b.

Figure 2:
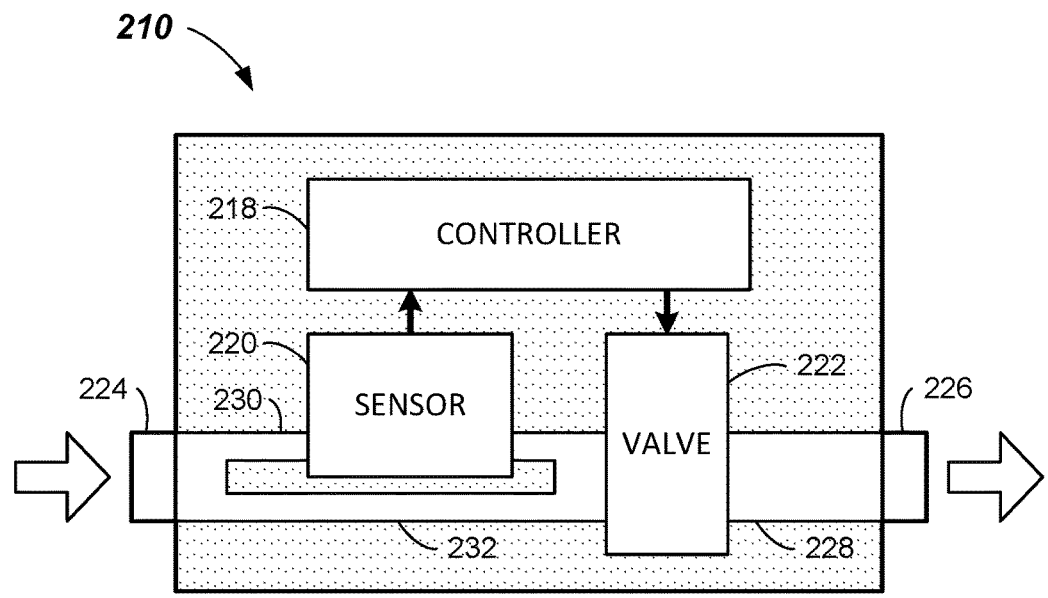
FIG. 2 illustrates a mass flow controller of an electronic device manufacturing system according to embodiments of the disclosure.

FIG. 2 illustrates an MFC 210 in accordance with one or more embodiments. MFC 210 may be used in electronic device manufacturing system 100 and, in some embodiments, may be identical or similar to MFC 110a and/or 110b. MFC 210 may operate within a specific pressure range, wherein pressures below that range may starve MFC 210 of gas, causing it to fail to achieve its setpoint, while pressures above that range may cause erratic mass flow rates. For example, in some embodiments, MFC 210 may operate within a pressure range of about 7 psia to 50 psia (pounds per square inch absolute). MFC 210 may operate within other suitable pressure ranges.

MFC 210 may include a controller 218, a thermal flow sensor 220, a flow rate control valve 222, an inlet port 224, an outlet port 226, and a flow path 228 coupled to and between inlet port 224 and outlet port 226. Flow path 228 may divide into a sensor flow path 230 and a bypass flow path 232. Thermal flow sensor 220 may measure a mass flow rate of a gas flowing there through received via sensor flow path 230, as described in more detail below in connection with FIG. 3A. Bypass flow path 232 may be coupled between inlet port 224 and flow rate control valve 222 and may be, for example, coupled parallel to thermal flow sensor 220. Bypass flow path 232 may establish a laminar flow of gas upstream and downstream of thermal flow sensor 220. Bypass flow path 232 may also set the flow range by diverting a portion of the total flow via thermal flow sensor 220. Bypass flow path 232 may further maintain a constant ratio of flow between the thermal flow sensor 220 and the total flow (independent of gas temperature and pressure). Suitable bypass geometries (not shown), such as, e.g., flat disks, annular slugs, and tube bundles, may be used. Sensor flow path 230 and bypass flow path 232 may rejoin at the input to flow rate control valve 222.

Flow rate control valve 222 may receive signals from controller 218 to regulate gas flow in response to input signals received by controller 218 from thermal flow sensor 220. Flow rate control valve 222 may be configured to increase or decrease the mass flow rate of a gas flowing through MFC 210 from, in some embodiments, a fully closed position (i.e., a 0% setpoint—no gas flow) to a fully open position (i.e., a 100% setpoint—full flow). Flow rate control valve 222 may, in some embodiments, have a ball-seat combination, wherein the moving part of the valve may be connected to the ball for closing against the seat. In some embodiments, flow rate control valve 222 may be a thermal, proportional solenoid, or piezo-actuator type valve. Other suitable flow rate control valves may be used.

Controller 218 may be configured to receive sensor information from thermal flow sensor 220 and to operate flow rate control valve 222. Controller 218 may also be configured to perform other functions and/or to communicate with other devices and/or controllers of an electronic device manufacturing system. Controller 218 may include several electronic components, such as, e.g., a microcontroller or other suitable computer processing device, one or more A/D converters, a valve drive, and other conditioning components that may be, e.g., mounted on a printed circuit board. For setting a desired mass flow rate, controller 218 may receive a setpoint command from a user and/or a system controller, such as, e.g., system controller 106 of electronic device manufacturing system 100. In some embodiments, the setpoint command may be a 0-5 VDC or 0-20 mA electrical signal representing a 0% to 100% mass flow rate. In some embodiments, MFC 210 may operate in less than full range, such as, e.g., from about 10% to 90% of full range. Other setpoint command values and/or operational ranges are possible. Controller 218 may also receive sensor information (e.g., mass flow rate measurements) from thermal flow sensor 220 and, in response, provide a control voltage to flow rate control valve 222 to increase or decrease the mass flow rate through MFC 210 to achieve the setpoint indicated by the setpoint command. For example, if a mass flow rate measurement received from thermal flow sensor 220 is lower than the setpoint, controller 218 may adjust flow rate control valve 222 to increase the mass flow rate through MFC 210 until the mass flow rate achieves the setpoint (or is within an acceptable range of the setpoint, such as, e.g., +/−1%).

Figure 3A:
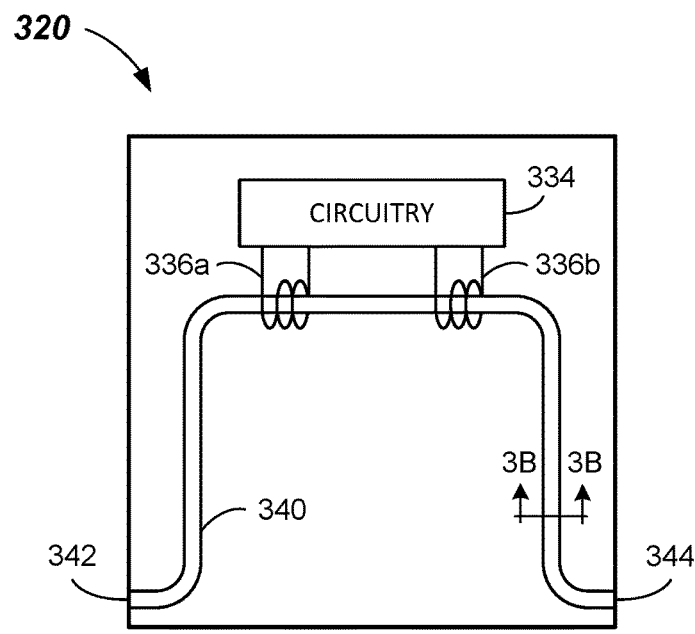
FIG. 3A illustrates a thermal flow sensor of a mass flow controller according to embodiments of the disclosure.
Figure 3B:
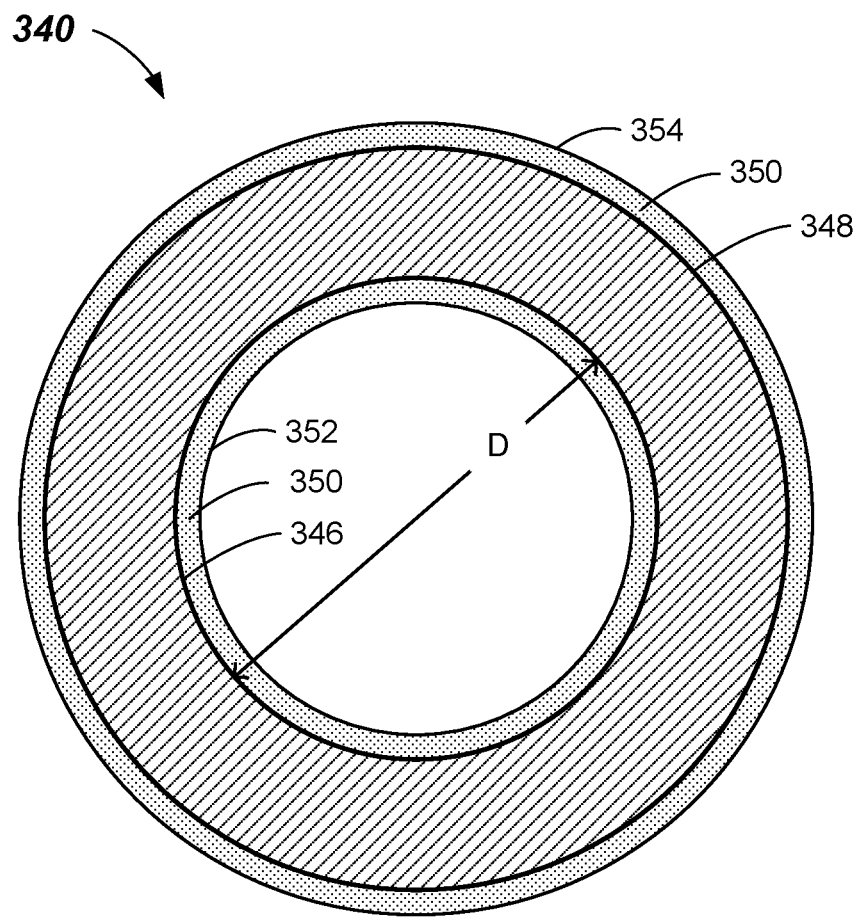
FIG. 3B illustrates a cross-sectional view of a sensor tube of the thermal flow sensor taken along section line 3B-3B of FIG. 3A according to embodiments of the disclosure.

FIG. 3A illustrates a thermal flow sensor 320 in accordance with one or more embodiments. In some embodiments, thermal flow sensor 320 may be identical or similar to thermal flow sensor 220 and/or may be used in MFC 210 (FIG. 2) and/or MFCs 110a and/or 110b (FIG. 1). Thermal flow sensor 320 may include circuitry 334, temperature-sensing/heater coils 336a and 336b, and a sensor tube 340. Sensor tube 340 may have an input 342 coupled to an inlet port, such as, e.g., inlet port 224 via sensor flow path 230 of FIG. 2. Sensor tube 340 may also have an output 344 coupled to the input of a flow rate control valve, such as, e.g., flow rate control valve 222 of FIG. 2. In some embodiments, sensor tube 340 may be made of or include stainless steel or Hastelloy®, and more particularly in some embodiments, stainless steel 316L or Hastelloy® C-22 or another Ni—Cr—Mo steel alloy. In some embodiments, sensor tube 340 may be subjected to an annealing process at above about 1000 degrees C. under a vacuum condition. Sensor tube 340 may, in some embodiments, have an inside diameter D as shown in FIG. 3B of about 1.3 mm to 1.7 mm. Other suitable inside diameters of sensor tube 340 are possible.

In some embodiments, temperature-sensing/heater coils 336a and 336b may have a dual role as a heater and a resistance-temperature detector. Mass flow rate is measured by thermal flow sensor 320 based on the heat conductivity of gases flowing there through. As a gas enters thermal flow sensor 320 through input 342 of sensor tube 340, temperature-sensing/heater coils 336a and 336b may warm the gas. Other embodiments may have alternative and/or additional heaters. Mass flow rate may be determined as a proportional change in temperature and may be converted by circuitry 334 into an electrical signal transmitted to an MFC controller, such as, e.g., controller 218 of FIG. 2. More particularly, temperature-sensing/heater coils 336a and 336b may be wound around sensor tube 340 as shown in FIG. 3A. Resistance of temperature-sensing/heater coils 336a and 336b and their accuracy at a given temperature may be known. Temperature-sensing/heater coils 336a and 336b may be connected to a bridge circuit of circuitry 334 and may be supplied with a regulated current from circuitry 334. Coil temperature in some embodiments may be about 70 degrees C. above ambient temperature. As gas flows through sensor tube 340, heat introduced by temperature-sensing/heater coils 336a and 336b may be carried downstream. This gas flow may cause upstream temperature-sensing/heater coil 336a to detect a cooler temperature than downstream temperature-sensing/heater coil 336b. The temperature difference may be directly proportional to the mass flow rate of the gas flowing through sensor tube 340. Circuitry 334 may determine the mass flow rate based on the sensed coil temperatures and may output an electrical signal representative of that determined mass flow rate. The output of thermal flow sensor 320 may therefore be a function of mass flow rate and may vary significantly for different gases.

In conventional MFCs where a corrosive gas, such as, e.g., chlorine (Cl2) or hydrogen bromine (HBr) flows through a sensor tube of the MFC, a corrosive reaction with the sensor tube material may occur at heated areas where moisture is present. The heated areas may have an elevated temperature of, e.g., 100 degrees C. or higher, and may be located at or near a heater such as temperature-sensing/heater coils 336a and 336b. Such corrosive reactions may change the heat conductance property of the sensor tube, which may cause inaccurate mass flow rates to be measured and responded to via inaccurate or unnecessary adjustment of a flow rate control valve.

To prevent or reduce the likelihood of such corrosive reactions, sensor tube 340 may be coated with a material to form a barrier layer. As shown in FIG. 3B, sensor tube 340 has an inner surface 346 and an outer surface 348. Inner surface 346 may be coated with a material 350 to form an inner barrier layer 352. In some embodiments, outer surface 348 may also be coated with material 350 to form an outer barrier layer 354. Material 350 may be applied via atomic layer deposition (ALD). Other suitable methods of applying material 350 to inner surface 346 and/or outer surface 348 may alternatively be used. In some embodiments, material 350 may be made of, or include, aluminum oxide (Al2O3) or tantalum pentoxide (Ta2O5). Inner barrier layer 352 may be formed in a single layer and/or may have a thickness of about 50 nm to 150 nm. Outer barrier layer 354 also may be formed in a single layer and/or may have a thickness of about 50 nm to 150 nm. Inner barrier layer 352 and/or outer barrier layer 354 may have other suitable thicknesses, and/or in some embodiments, may be formed from multiple material types. In some embodiments, inner barrier layer 352 and outer barrier layer 354 may be formed from different materials. Inner barrier layer 352 and/or outer barrier layer 354 may prevent or substantially reduce the likelihood of a corrosive reaction from occurring on inner surface 346 and/or outer surface 348, respectively, which may prevent or reduce the likelihood of an MFC, such as MFC 210 (FIG. 2), drifting beyond the MFC's mass flow rate accuracy specifications. This may improve the repeatability of flow detection by the MFC.

Figure 4:
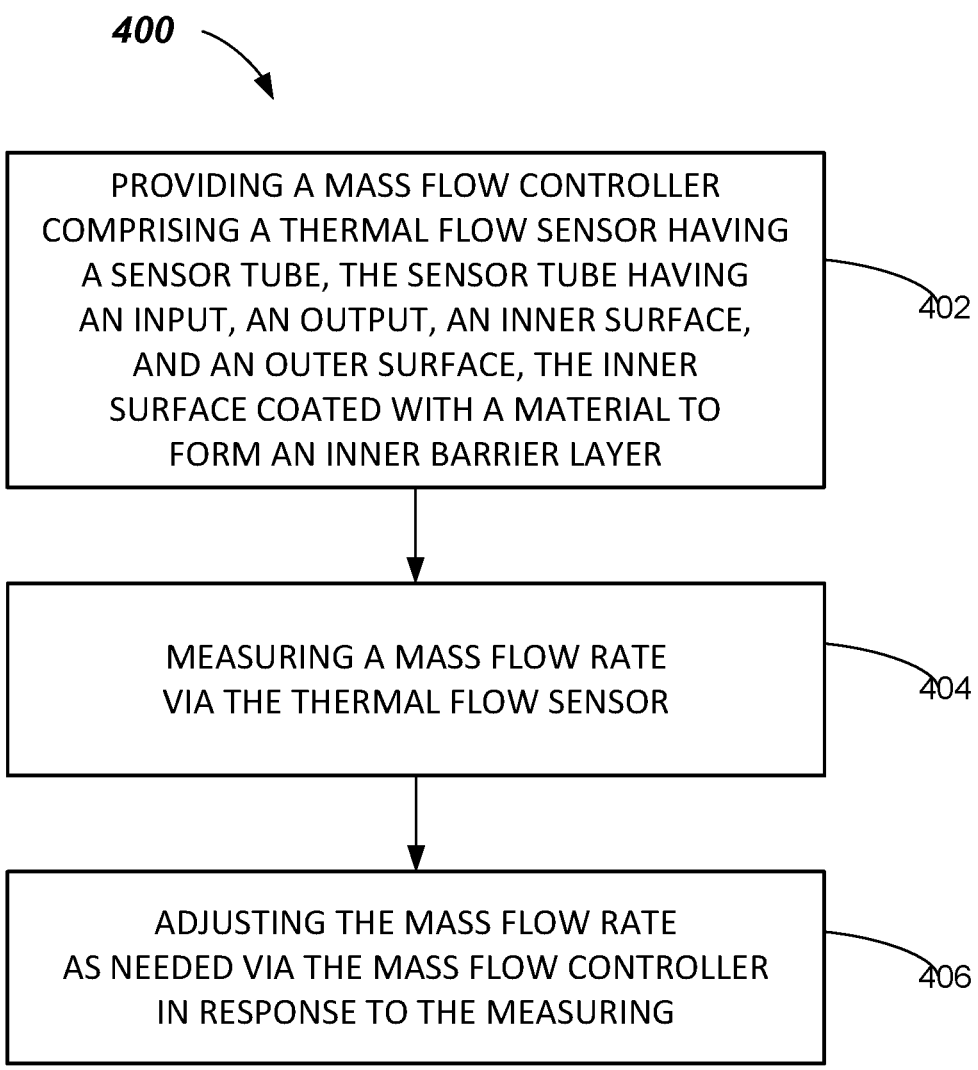
FIG. 4 illustrates a method of measuring and controlling a mass flow rate in an electronic device manufacturing system according to embodiments of the disclosure.

FIG. 4 illustrates a method 400 of measuring and controlling a mass flow rate in an electronic device manufacturing system in accordance with one or more embodiments. At process block 402, method 400 may include providing an MFC comprising a thermal flow sensor having a sensor tube, the sensor tube having an input, an output, an inner surface, and an outer surface, the inner surface coated with a material to form an inner barrier layer. For example, the MFC may be MFC 110a, 110b (FIG. 1), or 210 (FIG. 2) and may include thermal flow sensor 320 (FIG. 3A) having sensor tube 340, wherein sensor tube 340 may have inner surface 346 coated with material 350 to form inner barrier layer 352 (FIG. 3B).

At process block 404, a mass flow rate may be measured via the thermal flow sensor. For example, a mass flow rate of a gas flowing through MFC 210 (FIG. 2) may be measured by thermal flow sensor 220 (FIG. 2) or thermal flow sensor 320 (FIG. 3A).

And at process block 406, method 400 may include adjusting the mass flow rate as needed via the mass flow controller in response to the measuring. For example, in response to measuring a mass flow rate with thermal flow sensor 220 (FIG. 2) or thermal flow sensor 320 (FIG. 3), controller 218 may adjust flow rate control valve 222 as needed to adjust the mass flow rate through MFC 210 to achieve or come within an acceptable range of the setpoint of MFC 210.

The foregoing description discloses only example embodiments of the disclosure. Modifications of the above-disclosed apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. A mass flow controller comprising:
   an inlet port;
   an outlet port;
   a thermal flow sensor configured to measure a mass flow rate of a gas flowing through the mass flow controller, the thermal flow sensor having a sensor tube, the sensor tube having an input coupled to the inlet port, the sensor tube also having an output, an inner surface, and an outer surface, the inner surface coated with a first material to form an inner barrier layer and the outer surface coated with a second material to form an outer barrier layer, wherein one of the first material or the second material comprises tantalum pentoxide, and wherein the first material and the second material are different from each other;
   a flow rate control valve coupled between the output of the sensor tube and the outlet port, the flow rate control valve configured to increase or decrease the mass flow rate of the gas flowing through the mass flow controller; and
   a controller configured to receive sensor information from the thermal flow sensor and to operate the flow rate control valve.

2. The mass flow controller of claim 1, wherein the first material is applied via atomic layer deposition.

3. The mass flow controller of claim 1, wherein the inner barrier layer comprises a single layer.

4. The mass flow controller of claim 1, wherein the inner barrier layer has a thickness of 50 nm to 150 nm.

5. The mass flow controller of claim 1, wherein the sensor tube has an inside diameter of 1.3 mm to 1.7 mm.

6. The mass flow controller of claim 1, wherein the sensor tube comprises stainless steel.

7. The mass flow controller of claim 1, further comprising a bypass flow path coupled between the inlet port and the flow rate control valve, the bypass flow path coupled parallel to the thermal flow sensor.

8. An electronic device manufacturing system, comprising:
   a process chamber having a substrate support;
   a gas delivery system including a gas supply and a mass flow controller, the mass flow controller including a thermal flow sensor having a sensor tube, the sensor tube having an input, an output, an inner surface, and an outer surface, the inner surface coated with a first material to form an inner barrier layer and the outer surface coated with a second material to form an outer barrier layer, wherein one of the first material or the second material comprises tantalum pentoxide, and wherein the first material and the second material are different from each other; and
   a system controller configured to operate the process chamber and the gas delivery system.

9. The electronic device manufacturing system of claim 8, wherein the first material is applied via atomic layer deposition.

10. The electronic device manufacturing system of claim 8, wherein the inner barrier layer comprises a single layer.

11. The electronic device manufacturing system of claim 8, wherein the inner barrier layer has a thickness of 50 nm to 150 nm.

12. A method of measuring and controlling a mass flow rate in an electronic device manufacturing system, the method comprising:
   providing a mass flow controller comprising a thermal flow sensor having a sensor tube, the sensor tube having an input, an output, an inner surface, and an outer surface, the inner surface coated with a first material to form an inner barrier layer and the outer surface coated with a second material to form an outer barrier layer, wherein one of the first material or the second material comprises tantalum pentoxide, and wherein the first material and the second material are different from each other;
   measuring a mass flow rate via the thermal flow sensor; and
   adjusting the mass flow rate as needed via the mass flow controller in response to the measuring.

13. The method of claim 12, wherein the providing comprises applying the first material to the inner surface via atomic layer deposition.

14. The method of claim 12, wherein the inner barrier layer has a thickness of 50 nm to 150 nm.

15. The mass flow controller of claim 1, wherein the second material is applied via atomic layer deposition.

16. The electronic device manufacturing system of claim 8, wherein the second material is applied via atomic layer deposition.

17. The method of claim 12, wherein the providing comprises applying the second material via atomic layer deposition.

* * * * *